US006958929B2

(12) United States Patent
Abraham et al.

(10) Patent No.: US 6,958,929 B2
(45) Date of Patent: Oct. 25, 2005

(54) SENSOR COMPENSATION FOR ENVIRONMENTAL VARIATIONS FOR MAGNETIC RANDOM ACCESS MEMORY

(75) Inventors: David William Abraham, Croton, NY (US); Philip Louis Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 10/695,572

(22) Filed: Oct. 28, 2003

(65) Prior Publication Data

US 2005/0088875 A1   Apr. 28, 2005

(51) Int. Cl.[7] .......................... G11C 11/00; G11C 7/04
(52) U.S. Cl. ..................................... 365/158; 365/211
(58) Field of Search ............................ 365/158, 171, 365/173, 28, 211

(56) References Cited

U.S. PATENT DOCUMENTS 4,559,616 A * 12/1985 Bruder ..................... 365/28
6,608,790 B2 * 8/2003 Tran et al. ................. 365/211
6,775,196 B2 * 8/2004 Perner et al. .............. 365/211

* cited by examiner

*Primary Examiner*—Trong Phan
(74) *Attorney, Agent, or Firm*—Michael J. Buchenhorner; Wan Yee Cheung

(57) ABSTRACT

A compensation system for an array of magnetic memory cells measures local operating conditions and compensates for changes in the operating characteristics of the magnetic memory cells in the array that result from the changes in the operating conditions. The magnetic field strength near the magnetic memory array is measured. If the magnetic field strength rises above, or falls below certain predetermined threshold values, the write current used to alter the orientation of the magnetic fields in the magnetic memory cells is altered based upon the predetermined operating characteristics of the memory cells. A solenoid or similar type magnetic field generator may also be used to substantially compensate for variations in the sensed magnetic fields. In addition, the temperature of the environment in which the magnetic memory cells are operating is sensed and appropriate changes made in the write current. Temperature control means may also be used to compensate for sensed changes in the local operating environment.

22 Claims, 3 Drawing Sheets

SENSOR COMPENSATION FOR ENVIRONMENTAL VARIATIONS FOR MAGNETIC RANDOM ACCESS MEMORY

STATEMENT REGARDING FEDERALLY SPONSORED-RESEARCH OR DEVELOPMENT

The present invention was developed as part of federally sponsored DARPA Contract Number: MDA972-99-C-0009.

CROSS-REFERENCE TO RELATED APPLICATIONS

Not Applicable.

INCORPORATION BY REFERENCE OF MATERIAL SUBMITTED ON A COMPACT DISC

Not Applicable.

FIELD OF THE INVENTION

The invention disclosed broadly relates to the field of magnetic memory cell arrays. More particularly, the present invention relates to the use of a magnetic fields and/or temperature sensors in a magnetic memory array to compensate for and minimize the effects of fluctuations in the surrounding magnetic fields and temperature by varying the write currents used to alter the orientation of the magnetization in the memory cells, or altering the magnetic fields and temperature in the local environment.

BACKGROUND OF THE INVENTION

MRAM (magnetic random-access memory) tunnel junctions used in magnetic memory arrays must operate in a tight window of switching fields in order reliably to write data. Unfortunately, the magnetic fields in the operating environment of the chip are not under the control of the designer. In addition, temperature fluctuations can also affect the performance of magnetic memory cells by causing changes in their astroid parameters and similar problems. Therefore, tolerance for variances in operating conditions must be designed into the chips to allow the chips to operate in the fluctuating environment. This over designing of the chips increases the cost and size of the memory array.

Shielding of MRAM devices is possible using various arrangements of high permeability magnetic sheets in proximity to the device. However, due to a low shield factor (given by the ratio of external field to the field felt by the device) or an external field that exceeds the saturation field of the shield material, the MRAM device can be exposed to significant magnetic fields due to dynamic environmental sources. Shielding will also be ineffective if the fields imposed on the package are below the coercive field of the shielding as well. In addition, shielding magnetic memory arrays with sheets of high magnetic susceptibility materials in various geometries is expensive. Furthermore, in order to achieve a high shield factor (i.e. the ratio of the external field to the field at the MRAM chip) more sophisticated and, therefore, expensive geometries must be employed. Nevertheless, it would be desirable to reduce these fields further, or else reduce the effect of these fields on the device, particularly during the write operation when fluctuations in magnetic fields may cause a critical write error.

Typically, the magnetic fields required to switch the MRAM device are in the range of 30 to 70 Oersted (Oe), and the standard deviation in the switching fields of the devices, or the applied fields, either intentionally or from external magnetic noise sources, must be held to less than 2 or 3 Oe. If this requirement is not met, the errors in the write process due to either writing half-selected cells or failing to write the intended target cells will rise to unacceptable levels. Unfortunately, much of this field spread budget is consumed in fabrication tolerances and so the external field effects should be minimized as much as possible, preferably below 0.2 Oe or so.

SUMMARY OF THE INVENTION

An application of the present invention is directed toward a magnetic random access memory circuit that includes a sensor for producing a sensor signal representing a sensed external condition that may affect the performance of the magnetic memory array. The sensor may be a magnetometer that senses a local magnetic field wherein the magnetometer is integrated with the magnetic random access memory circuit in a single integrated circuit or package. Alternatively, the sensor may be a thermometer that senses the temperature of the operating environment of the magnetic random-access memory circuit. A compensation circuit compensates for the sensed external conditions in the operating environment. The compensation circuit is preferably configured to reduce or increase the write current for the word and bit lines of the magnetic memory array by an amount required to compensate for the sensed external conditions. The compensation circuit may also include a magnetic field generator such as a solenoid that generates a compensating magnetic field to compensate for the sensed external conditions. The compensation circuit also preferably includes a temperature controller for maintaining the temperature of the operating environment at a substantially constant temperature.

Another application of the present invention is directed toward a method of compensating for changes in an operating environment of a magnetic memory array. In accordance with the method, a change in the operating environment of the magnetic memory array is sensed. The sensed change may be a change in a local magnetic field, stress, RF radiation, local temperature and/or other local condition. The sensed change in the local magnetic field or temperature is compensated for by adjusting the write current for the word and bit lines of the magnetic memory array by an amount required to compensate for the sensed change in the local conditions. The sensed change in the local magnetic field may also be compensated for by generating a compensating magnetic field with a solenoid. Similarly, a sensed change in the temperature may be compensated for by altering the amount of heat provided to maintain a relatively constant local temperature.

Yet another aspect of the present invention is directed toward an information handling system. The information handling system has a first magnetic memory array. A first sensor is positioned near the first magnetic memory array to sense a local operating condition of the first magnetic memory array. A first compensation circuit compensates for the sensed local operating condition. A second magnetic memory array has a second sensor positioned near it for sensing a local operating condition of the second magnetic memory array. A second compensation circuit compensates for the sensed local operating condition. A network connection transfers information between the first magnetic memory array and the second magnetic memory array.

DETAILED DESCRIPTION

Figure 1:
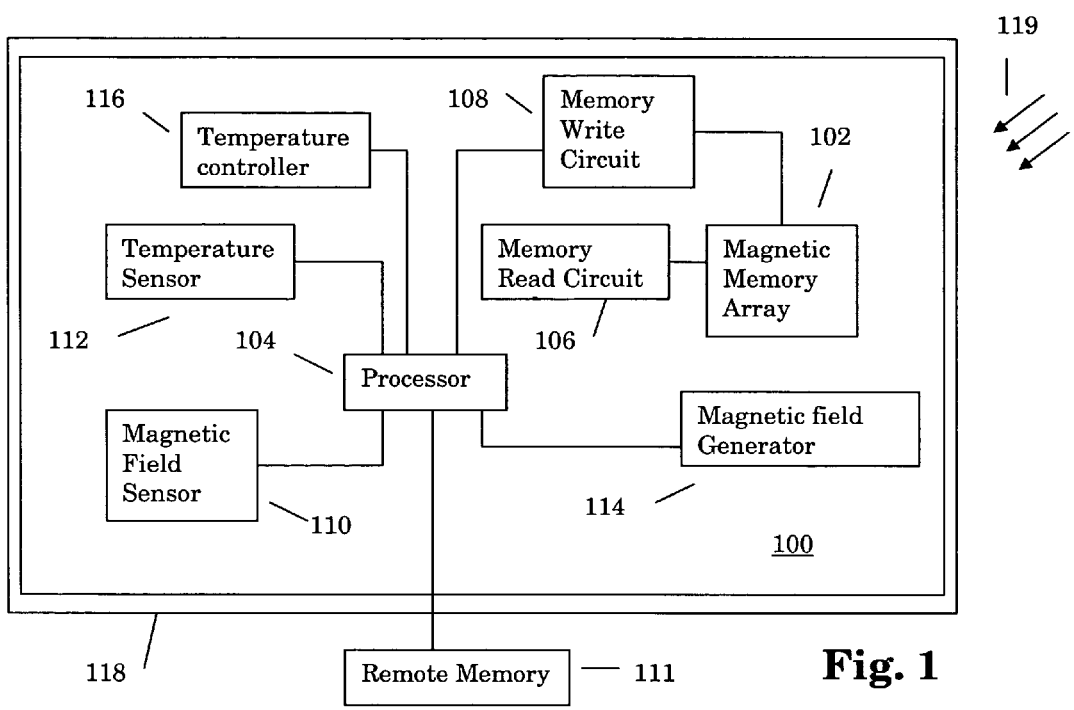
FIG. 1 is an illustration of an MRAM employing a magnetic field and temperature compensation scheme according to preferred embodiment of the present invention.

Referring now to FIG. 1, a preferred embodiment of the present invention is shown. The embodiment comprises an information processing system 100 comprising a magnetic memory array 102 that is managed and utilized by a processor 104. A memory read circuit 106 reads information stored in the magnetic memory array 102 and a memory write circuit 108 writes information to the magnetic memory array 102. A magnetic field sensor 110 senses the magnetic field 119 strength in the vicinity of the magnetic memory array 102 and provides a signal that represents the field strength to the processor 104. In a similar fashion, a temperature sensor 112 such as a thermocouple or other thermometric device senses the local temperature and provides a signal representing the sensed temperature to the processor 104. The temperature and the magnetic field 119 are preferably sensed as close to the magnetic memory array 102 as possible such that the magnetic field 119 and temperature sensed by the sensors 110 and 112 respectively approximates that of the magnetic memory array 102. In addition, while single sensors 110 and 112 are shown in FIG. 1 as located in the information processing system 100, it will be appreciated that an array of sensors 110 and 112 could be placed in various locations surrounding the magnetic memory array 102. A magnetic field generator 114 is provided that is controlled by the processor 104 to produce predetermined compensating magnetic fields to compensate for the ambient magnetic fields in the environment. Likewise, a temperature controller 116 is selectively controlled by the processor 4 to maintain a substantially constant temperature in the local environment of the magnetic memory array 102. The magnetic memory array 102 and associated components are preferably surrounded by magnetic shielding 118 that reduces the magnetic fields surrounding the memory array 102.

The embodiment of FIG. 1 preferably functions as follows. First, the processor 104 interrogates the magnetic field sensor 110. The interrogation can be initiated by a request to access the memory 102, a predetermined schedule, or any other desired scheme. The processor 104 then compares the output received from the magnetic field sensor 110 to a set of predetermined compensation values or parameters stored in a remote memory 111 that is unaffected by changes in the local environment. A remote memory 11 is used so that unfavorable local conditions will not prevent the processor 104 from performing its compensation functions. The predetermined values are calculated based upon the known switching characteristics of the magnetic memory cells. The values represent magnetic field strength threshold values that have been experimentally determined to impact, or come close to impacting, the performance of the magnetic memory array 102. If the processor determines that the sensed magnetic field 119 has surpassed one of these threshold levels, the processor 104 attempts to take corrective actions. One example of such a corrective action would be for the processor 104 to instruct the memory write circuit 108 to decrease or increase the write current used to write information to the magnetic memory cells in the magnetic memory array 102 to compensate for any drifts that have occurred in the magnetic fields in the local environment. Varying the write current will insure that the coercive fields created to alter the orientation of the magnetic fields in the memory cells of the magnetic memory array 102 have the proper field strength required to alter the memory cells. The variation is selected to be large enough to overcome the influences of any ambient magnetic fields in the area. Another way to overcome the influence of any sensed local magnetic fields would be for the processor 104 to instruct the magnetic field generator 114 to produce a compensatory and offsetting magnetic field that substantially negates the effect of any local magnetic field 119. The magnetic field generator 114 could be a solenoid or similar type device.

The processor 104 can also activate the temperature controller 116 to compensate for any changes in the temperature in the local environment. If the temperature sensor 112 indicates that the temperature has risen above a predetermined threshold value that was determined based upon the known temperature dependent switching characteristics of the magnetic memory cells in the magnetic memory array 102, the temperature controller is then activated by the processor 104 to lower the temperature of the local environment. Similarly, if the temperature sensor 112 senses that the temperature in the local environment of the magnetic memory array 102 has fallen below a specified threshold, the processor 104 activates the temperature controller 116 to raise the temperature of the local environment. Thus, the temperature controller 116 functions to maintain the local environment of the magnetic memory array 102 at a substantially constant temperature. In various embodiments, the temperature controller 116 can be a fan, air conditioner, heater, resistor or some combination thereof.

What has been shown in FIG. 1 and discussed above is a highly-simplified depiction of a programmable computer apparatus. Those skilled in the art will appreciate that other low level components and connections are required in any practical application of such a computer apparatus. However, the low level components and connections needed to implement such an apparatus are well known in the art and beyond the scope of the disclosure of the present invention.

Figure 2:
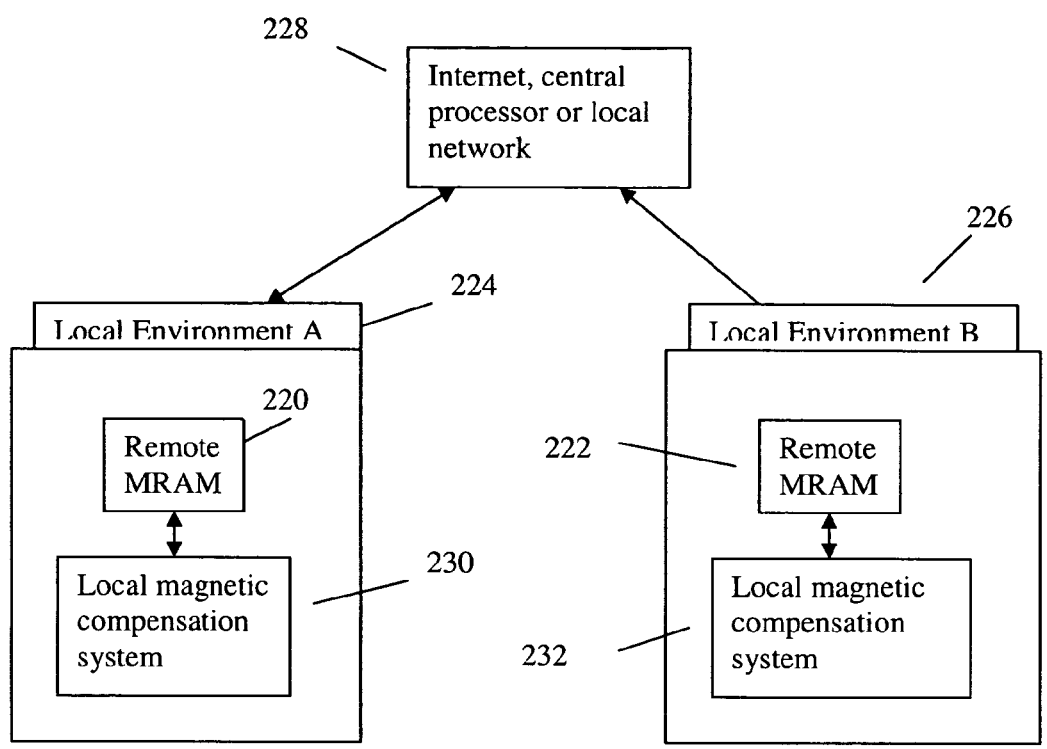
FIG. 2 shows a representation of an environment wherein a system for handling information in accordance with an embodiment of the present invention can be advantageously used.

Referring now to FIG. 2, a representation of an environment 200 wherein a system in accordance with the invention can be advantageously used is shown. In FIG. 2, a first remote magnetic memory array 220 located in a local environment A 224 and a second magnetic memory array 222 located in a local environment B 226 are connected by an internet connection, central processor or local network 228. Each magnetic memory array 220 and 222 has its own associated local magnetic compensation system 230 and 232. The local magnetic compensation systems 230 and 232 have their own local sensors, as described in more detail above with respect to FIG. 1, that allow the compensation systems 230 and 232 to correct for changes that in their respective local environments A 224 and B 226. Thus, if a larger than expected magnetic field is present in local environment A 224, the local magnetic compensation system 230 can lower the write current used to write to the magnetic memory array 220 such that the desired net write fields are used for the selected word and bit lines. In a similar manner, the write current can be varied to produce the desired half-select fields for half-selected bits.

The local environment A 224 and the local environment B 226 are preferably miles apart so that information is backed up in an environment (B 266) that is not affected by the environmental conditions of local environment A 224. Since all electronic devices produce magnetic fields and heat, a magnetic memory array 220 that is physically very close to a second magnetic memory array 222 may be subjected to a dramatically different magnetic field and temperature conditions due to the positioning of nearby electrical components. Therefore, the proximity of the local magnetic compensation systems 230 and 232 is a design choice that depends upon the expected variations in the operating environments of the magnetic memory arrays 230 and 232. In addition, the sensitivities of the magnetic memory arrays 220 and 222 to changes in their operating environments will determine how responsive the local magnetic compensation systems 230 and 232 for each respective magnetic memory array 220 and 222 need to be.

Figure 3:
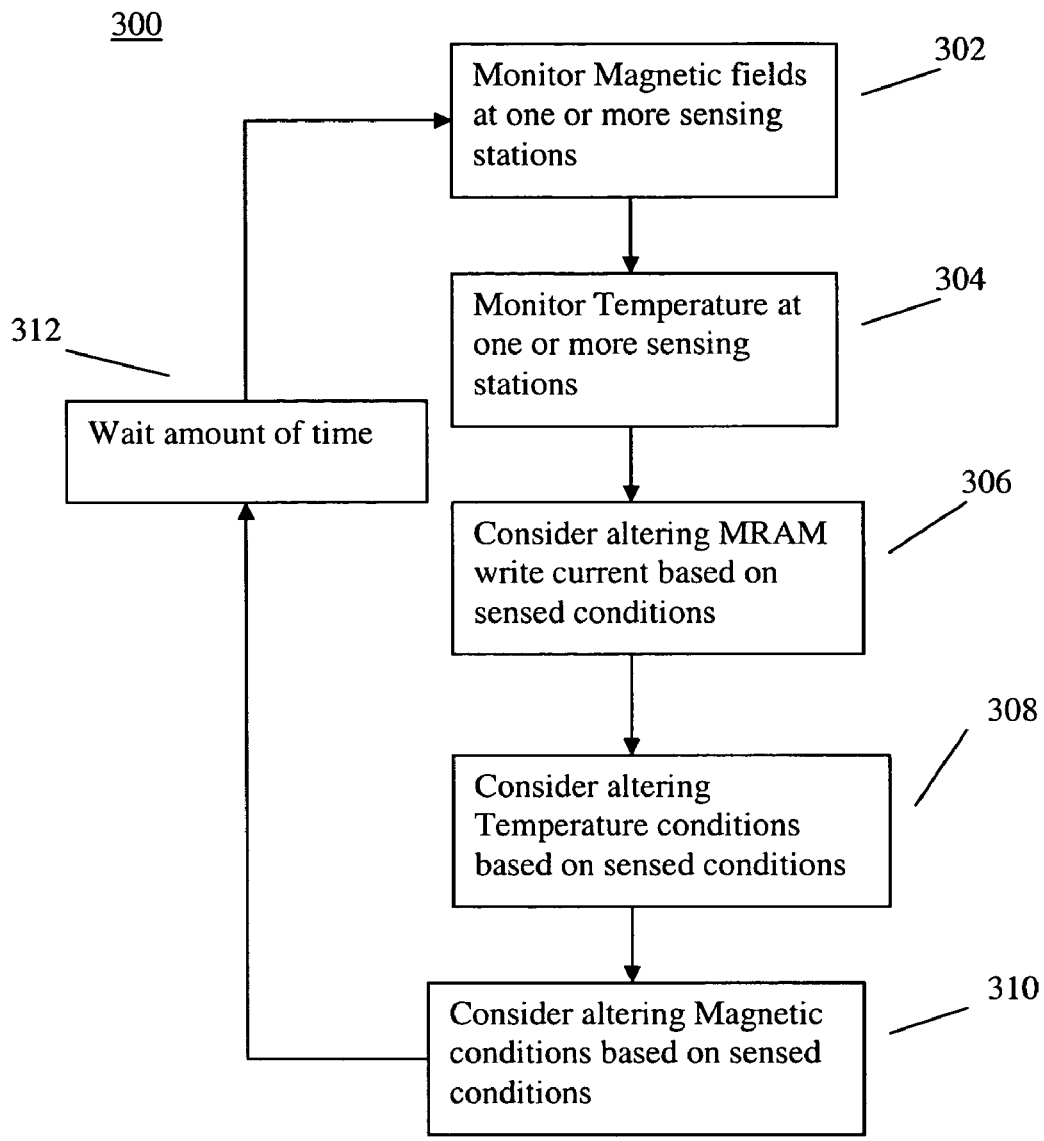
FIG. 3 is a flow chart illustrating a method in accordance with a preferred embodiment of the present invention.

Referring now to FIG. 3, a preferred method 300 of implementing an embodiment of the present invention is shown. The method 300 begins in step 302 with the monitoring of local magnetic fields at one or more sensing stations. Preferably, the method then proceeds to step 304 wherein the local temperature is monitored at one or more sensing stations. Once the temperature and magnetic field strength have been measured, the method proceeds to step 306 wherein it is considered whether or not to alter the write current used to write to a MRAM based upon the sensed magnetic field and temperature conditions. For example, if an increased magnetic field is detected, the write current may be lowered to insure that the appropriate write field is generated. The write current may also be varied to account for variations in the temperature. This version of the sensor driven compensation scheme is particularly useful with thermally assisted writing methods in which tunnel junction materials are selected to be temperature dependent and current is used to heat the device on demand. Once a decision has been made with respect to the write current, the method proceeds to step 308 wherein it is determined whether or not the temperature conditions in the operating environment of the MRAM need to be altered based upon the sensed conditions. As discussed above, if a temperature rise above a predetermined threshold level is detected, compensation measures such as the turning on of a fan can be taken. The threshold levels are based upon the predetermined switching characteristics of the particular MRAM memory cells being monitored. Next, in step 310, the method determines whether or not the magnetic conditions of the environment in which the monitored MRAM is operating need to be altered. The magnetic operating conditions can be altered in a predictable manner through the use of a strategically placed solenoid or similar type device. Once the method has proceeded through steps 302–310, an amount of time is waited in step 312 before restarting the method at step 302. By constantly repeating the method, the method compensates for dynamic changes in the magnetic fields and temperature in the operating environment of the MRAM device.

The present invention offers substantial benefits over the prior art in that it allows variations and drifts in the operating environment of an MRAM device to be compensated for dynamically as the changes occur. Through the use of write current modifications, environmental changes can be compensated for without altering the operating environment. This allows a single design to operate in almost any magnetic environment without the need for elaborate shielding or control over local conditions. In addition, local sensors allow the operating environment to be altered to accommodate variations in the operating environment of the MRAM. Therefore, the present invention represents a substantial improvement upon the prior art.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention. Therefore, while there has been described what is presently considered to be the preferred embodiment, it will be understood by those skilled in the art that other modifications can be made within the spirit of the invention.

What is claimed is:

1. A magnetic random access memory circuit, comprising:
   a sensor for producing a sensor signal representing a sensed external condition that affects performance of the magnetic memory; and
   a compensation circuit for compensating for the sensed external condition;
   wherein the compensation circuit is configured to adjust the write current for word and bit lines of the magnetic memory by an amount required to substantially compensate for the effect of the sensed external condition on the write current required to reliably write data.

2. The circuit of claim 1 wherein the compensation circuit is configured to reduce the write current for the word and bit lines by an amount required to substantially compensate for a sensed external magnetic field.

3. The circuit of claim 1 wherein the compensation circuit comprises a magnetic field generator that generates a compensating magnetic field to substantially compensate for the sensed external condition.

4. The circuit of claim 3 wherein the magnetic field generator comprises a solenoid for generating the compensating magnetic field.

5. The circuit of claim 1 wherein the sensor comprises a magnetometer for sensing an external magnetic field.

6. The circuit of claim 5 wherein the magnetometer is integrated with the magnetic random access memory circuit in a single package.

7. The circuit of claim 5 wherein the magnetometer is integrated with the magnetic random access memory circuit in a single integrated circuit.

8. The circuit of claim 1 wherein the sensor comprises a thermocouple for sensing a temperature of an operating environment of the magnetic random access memory circuit.

9. The circuit of claim 8 wherein the compensation circuit comprises a temperature controller for altering the temperature of the operating environment.

10. The circuit of claim 1 wherein the compensation circuit comprises a remote memory for storing compensation information.

11. A method of compensating for changes in an operating environment of a magnetic memory array comprising the steps of:
    sensing a change in the operating environment of the magnetic memory array;
    compensating for the sensed change in the operating; and
    adjusting the write current for word and bit lines of the magnetic memory by an amount required to substantially compensate for the effect of the sensed external condition on the write current required reliably to write data.

12. The method of claim 11 wherein sensing a change in the operating environment comprises sensing a change in a local magnetic field.

13. The method of claim 12 wherein compensating for the sensed change comprises adjusting a write current for word and bit lines of the magnetic memory array by an amount required to compensate for the sensed change.

14. The method of claim 13 wherein compensating for the sensed change comprises reducing the write current for the word and bit lines by an amount required to compensate for the sensed change.

15. The method of claim 11 wherein the sensed change is a change in a local magnetic field and the method comprises generating a compensating magnetic field to compensate for the sensed change.

16. The method of claim 15 comprising generating the compensating field with a solenoid.

17. The method of claim 11 wherein the sensed change is a change in a local temperature.

18. The method of claim 17 wherein compensating for the sensed change comprises maintaining the local temperature at a substantially constant temperature.

19. An information handling system comprising:
 a first magnetic memory array;
 a first sensor positioned near said first magnetic memory array for sensing a local operating condition of said first magnetic memory array; and
 a first compensation circuit for substantially compensating for said sensed local operating condition;
 wherein the system is configured to adjust the write current for word and bit lines of the magnetic memory by an amount required to substantially compensate for the effect of the sensed external condition on the write current required reliably to write data.

20. The information handling system of claim 19 further comprising:
 a second magnetic memory array;
 a second sensor positioned near said second magnetic memory array for sensing a local operating condition of said second magnetic memory array; and
 a second compensation circuit for substantially compensating for said sensed local operating condition.

21. The information system of claim 20 further comprising a network connection for transferring information between said first magnetic memory array and said second magnetic memory array.

22. The information system of claim 21 comprising a remote memory that is not affected by local conditions for storing compensation information used by said compensation circuits.

* * * * *